US007078649B2

(12) United States Patent
Okumura

(10) Patent No.: US 7,078,649 B2
(45) Date of Patent: Jul. 18, 2006

(54) METHOD OF FORMING SEMICONDUCTOR THIN-FILM AND LASER APPARATUS USED THEREFORE

(75) Inventor: Hiroshi Okumura, Kanagawa (JP)

(73) Assignee: NEC LCD technologies, Ltd., Kanagawa (JP)

( * ) Notice: Subject to any disclaimer, the term of this patent is extended or adjusted under 35 U.S.C. 154(b) by 4 days.

(21) Appl. No.: 10/615,670

(22) Filed: Jul. 8, 2003

(65) Prior Publication Data

US 2004/0011772 A1 Jan. 22, 2004

(30) Foreign Application Priority Data

Jul. 18, 2002 (JP) .............................. 2002-210202

(51) Int. Cl.
*B23K 26/38* (2006.01)
*H01L 29/786* (2006.01)
*H01L 21/027* (2006.01)
*G02F 1/136* (2006.01)

(52) U.S. Cl. .................. 219/121.69; 438/462; 257/797
(58) Field of Classification Search ............ 219/121.6, 219/121.65, 121.66, 121.68, 121.69, 121.76, 219/121.78, 121.85; 438/487

See application file for complete search history.

(56) References Cited

U.S. PATENT DOCUMENTS

| 4,486,884 | A | * | 12/1984 | White ........................ 372/3 |
| 5,426,010 | A | * | 6/1995 | Morton ....................... 430/22 |
| 5,731,046 | A | * | 3/1998 | Mistry et al. ............... 427/553 |
| 5,811,751 | A | * | 9/1998 | Leong et al. ............ 219/121.6 |
| 6,034,378 | A | * | 3/2000 | Shiraishi .................. 250/559.29 |
| 6,225,011 | B1 | * | 5/2001 | Gotoh et al. ................. 430/22 |
| 6,274,206 | B1 | * | 8/2001 | Turchan et al. ............. 427/553 |
| 6,530,918 | B1 | * | 3/2003 | Ueno et al. .................. 606/10 |
| 6,897,956 | B1 | * | 5/2005 | Noguchi et al. ............ 356/401 |

(Continued)

FOREIGN PATENT DOCUMENTS

JP 403128188 A * 5/1991

(Continued)

OTHER PUBLICATIONS

T. Nohda et al. Improving the Uniformity of Poly-Si Films using an Excimer Laser Annealing Method. The Institute of Electronics, Information and Communication Engineers. Dec. 10, 1992. pp. 53-58 vol. 92 No. 368.

(Continued)

*Primary Examiner*—Samuel M. Heinrich
(74) *Attorney, Agent, or Firm*—Katten Muchin Ronenman LLP.

(57) ABSTRACT

A method of forming a semiconductor thin-film constitutes an alignment mark in a laser annealing process. A first laser beam is irradiated to a semiconductor thin-film to form a first irradiated region. A second laser beam, which is coaxial with the first laser beam, is irradiated to the thin-film in such a way as not to overlap with the first irradiated region, thereby forming a second irradiated region and a non-irradiated region. An alignment mark is formed by using an optical constant difference between the second irradiated region and the non-irradiated region. The second laser beam may be irradiated to the thin-film in such a way as to overlap with the first irradiated region, where an alignment mark is formed by using an optical constant difference between the first and second irradiated regions or between the second irradiated region and the non-irradiated region. Preferably, the thin-film is made of a-Si or poly-Si.

21 Claims, 6 Drawing Sheets

U.S. PATENT DOCUMENTS

2004/0011772 A1* 1/2004 Okumura ............... 219/121.69
2004/0120050 A1* 6/2004 Tsukihara et al. ........... 359/629

FOREIGN PATENT DOCUMENTS

| JP | 5-211167 | 8/1993 |
| JP | 8-071780 | 3/1996 |
| JP | 408206868 A * | 8/1996 |
| JP | 409223648 A * | 8/1997 |
| JP | 410328864 A * | 12/1998 |
| JP | 411114690 A * | 4/1999 |
| JP | 2001-035806 | 2/2001 |

OTHER PUBLICATIONS

Korean Office Action issued on Apr. 27, 2005.

* cited by examiner

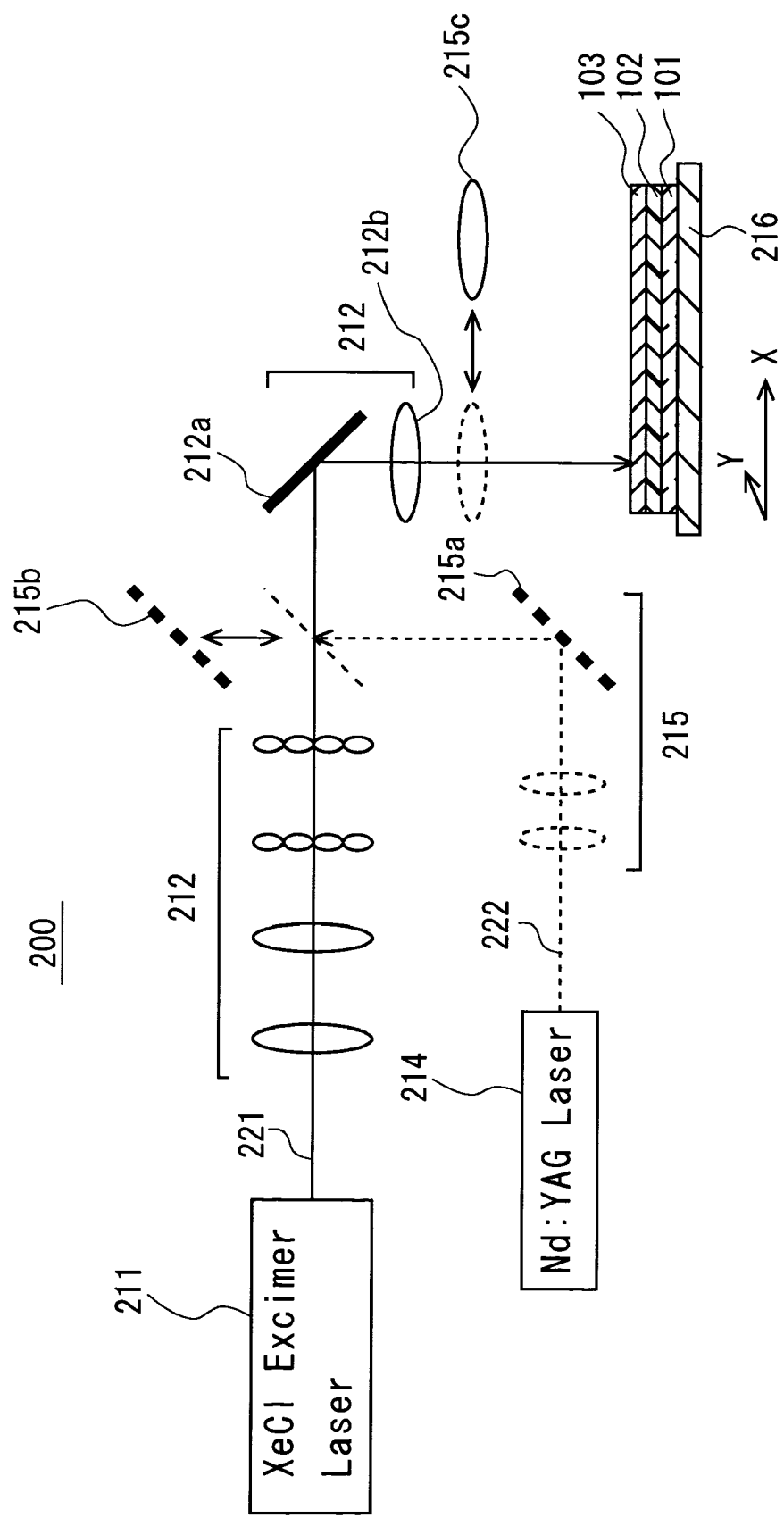

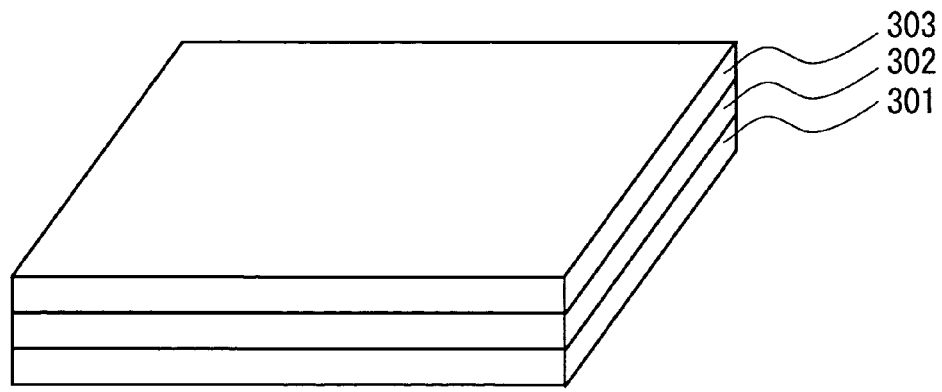
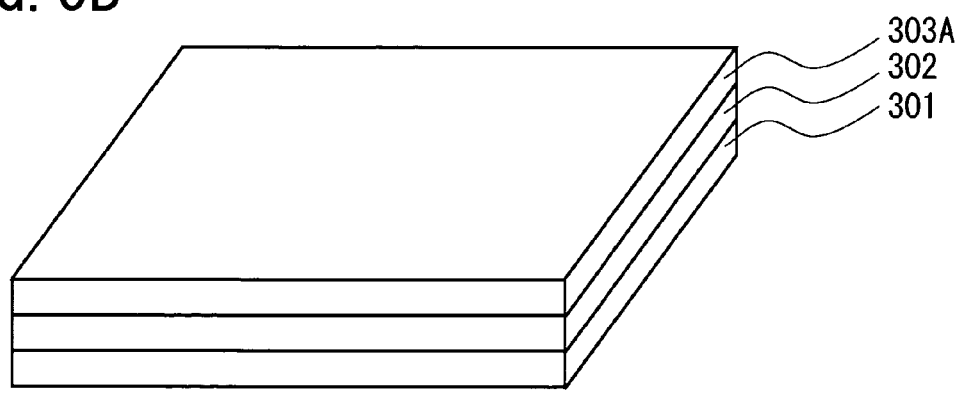
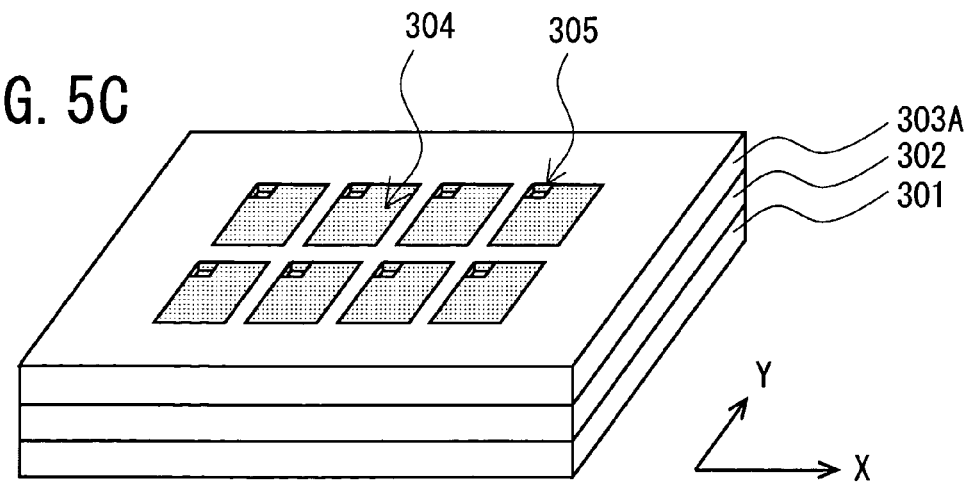

METHOD OF FORMING SEMICONDUCTOR THIN-FILM AND LASER APPARATUS USED THEREFORE

BACKGROUND OF THE INVENTION

1. Field of the Invention

The present invention relates to a method of forming a semiconductor thin-film and a laser apparatus used therefor. More particularly, the invention relates to a method of forming a semiconductor thin-film applicable to the fabrication of so-called polysilicon Thin-Film Transistors (TFTs), in which desired alignment marks are formed in the thin-film, and a laser apparatus that makes it possible to conduct the method.

2. Description of the Related Art

In recent years, various improved polysilicon TFTs have been developed vigorously as an electronic element for forming an integrated circuit on a glass plate. To form a polysilicon (poly-Si) thin-film (which may be simply referred as "film" hereinafter) used for polysilicon TFTs, the so-called "excimer laser annealing method" has been popularly used. In this method, an amorphous silicon (a-Si) film is formed on or over the surface of a glass plate and thereafter, an excimer laser beam is selectively irradiated to desired parts of the a-Si film for a short period, thereby temporarily melting the a-Si film in the parts due to heat and re-crystallizing the same after cooling in the atmosphere. Thus, the irradiated parts of the a-Si film by the laser beam are selectively turned to poly-Si regions, in other words, poly-Si regions are selectively formed within the a-Si film.

One of the known excimer laser apparatuses applicable to the above-described "excimer laser annealing method", which has already come onto the market, has a linear aperture of approximately 300 mm×0.4 mm and is designed to generate a laser beam having a linear spot on an object or target. On operation, the beam or spot is scanned along the surface of the target in the widthwise direction of the linear spot at a pitch of several tens micrometers.

However, when the above-described "excimer laser annealing method" is used for forming poly-Si TFTs with the known excimer laser apparatus, there is a known problem that the obtainable characteristics of poly-Si TFTs formed in the irradiated part are likely to be non-uniform. This is because the heating effect of the irradiated laser beam to the a-Si film in the periphery of the irradiated part is different from that in the middle part of the same irradiated part and as a result, the microstructure in the said periphery is different from that in the said middle part. This problem is disclosed in the article entitled "Improving the Uniformity of Poly-Si Films using an Excimer Laser Annealing Method" written by T. Nohda et al., Technical Report of IEICE (SDM92-112), published in December 1992, pp. 53–58.

The above-described problem can be solved by an improved laser annealing method disclosed in the Japanese Patent No. 3163693 issued on Mar. 2, 2001. In this method, TFTs are gathered in the irradiation range of a laser beam, where a uniform energy density (i.e., irradiation intensity) of the laser beam is obtainable. This is to exclude the above-described heating effect difference of a laser beam in the known laser annealing method using a scanning laser beam. The laser beam in the form of pulse is irradiated to the whole range two or more times without scanning.

With the improved method disclosed in the Japanese Patent No. 3163693, the area or size of the irradiation range varies dependent on the energy of the pulsed laser beam. Recently, an improved laser light source has already been developed for this purpose, which generates laser beam pulses with a high energy density in such a way that an area of approximately 40 mm×50 mm corresponding to the size of a LCD (Liquid-Crystal Display) panel for portable telephones is fully irradiated.

In the above-described improved laser annealing method disclosed in the Japanese Patent No. 3163693, it is important to align the irradiation range of a laser apparatus with the TFT region where poly-Si TFTs are formed. To realize this alignment, it is popular to form alignment marks on the glass plate and to provide a video camera for reading or recognizing the marks onto the laser apparatus. This technique is disclosed in, for example, Japanese Non-Examined Patent Publication No. 8-71780 published in Mar. 19, 1996.

However, if a video camera is additionally provided on the laser apparatus, there arises a problem that the structure of the laser apparatus is complicated and at the same time, the dimensions of the apparatus are increased. In particular, the size of a rectangular glass plate for LCDs has now become approximately 1 m×1 m. Therefore, if a mark-reading or mark-recognizing chamber is additionally provided on the known laser apparatus along with the annealing chamber, the footprint (i.e., the occupation area) of the apparatus would be remarkably expanded. Moreover, to align the irradiation range of the laser apparatus with each of the TFT regions of the glass plate, the movable stage of the laser apparatus needs to be not only translational along the X and Y axes but also rotatable in the X-Y plane for θ compensation. At the same time, the said stage needs to be configured in such a way that fine adjustments are possible. As a result, if so, the said stage would be complicated in structure, the fabrication cost of the laser apparatus would be raised, and the rate of operation thereof would be lowered.

Furthermore, if a video camera is provided on the known laser apparatus and alignment marks are formed on the glass plate, a time for reading or recognizing the alignment marks on the glass plate and a time for alignment between the apparatus and the glass plate are essential. Thus, there is a problem that the throughput for the laser annealing process is lowered.

Additionally, to form the alignment marks on the glass plate, a lithography process for forming a mask pattern and an etching process for selectively etching the material for the marks using the mask pattern are necessary. Therefore, there arises a problem that the total number of the necessary process steps for fabricating the TFTs on the glass plate increases.

To solve the above-described problems, an idea that the alignment marks are formed in the laser annealing process is effective. In this idea, an a-Si film is selectively melted temporarily by the irradiation of a laser beam and cooled in the atmosphere, thereby crystallizing the irradiated part of the a-Si film to result in a poly-Si region. Since an a-Si film and a poly-Si film are different in optical constants from each other, alignment marks can be made with a crystallized (i.e., poly-Si) region or regions and a non-crystallized (i.e., a-Si) region or regions.

However, the laser beam diameter for the TFTs is in the order of centimeters (cm) while the size of the alignment marks for a so-called stepper (which is used for a subsequent lithography process) is in the order of micrometers (μm). Therefore, to form the alignment marks with a desired high accuracy, the accuracy of finishing of comparatively large-sized optical elements in the order of 10 cm (which is required for generating a laser beam diameter in the order of cm) needs to be in the order of approximately 10 nm or less (which is required for forming a laser beam diameter in the order of μm). In this case, the fabrication cost of required optical systems for the laser apparatus will be extremely raised compared with ordinary optical systems applicable to forming a laser beam diameter in the order of cm.

Moreover, it is not realistic to provide a mechanism for changing the laser beam diameter from the order of cm to the order of μm for the purpose of forming the alignment marks. Therefore, when the alignment marks are formed, a laser beam diameter in the order of μm needs to be generated with an appropriate mask. In this case, however, there is a problem that a high-resolution mask is necessary. Moreover, there is a possibility that desired alignment marks are not obtained if the height accuracy of the stage, the thickness accuracy of the glass plate, and/or the surface roughness accuracy of the glass plate is/are not so high because of shallowness of the depth of focus of the laser beam.

SUMMARY OF THE INVENTION

Accordingly, an object of the present invention is to provide a method of fabricating a semiconductor thin-film that makes it possible to form an alignment mark in a laser annealing process, and a laser apparatus that makes it possible to conduct the method.

Another object of the present invention is to provide a method of fabricating a semiconductor thin-film that makes it possible to form a semiconductor thin-film at a low cost and high throughput in such a way that an annealed semiconductor region is obtainable with a good uniformity, and a laser apparatus that makes it possible to conduct the method.

Still another object of the present invention is to provide a laser apparatus that is configured to have a narrow footprint and a high processing capability, fabricated at a low cost, and operated at a high availability factor.

The above objects together with others not specifically mentioned will become clear to those skilled in the art from the following description.

According to a first aspect of the present invention, a method of forming a semiconductor thin-film is provided, which comprises:

irradiating a first laser beam to a semiconductor thin-film to form a first irradiated region; and irradiating a second laser beam to the thin-film in such a way as not to overlap with the first irradiated region, thereby forming a second irradiated region and a non-irradiated region;

wherein the second laser beam is irradiated to the thin-film to be coaxial with the first laser beam;

and wherein an alignment mark is formed by using an optical constant difference between the second irradiated region and the non-irradiated region.

With the method according to the first aspect of the present invention, a first laser beam is irradiated to a semiconductor thin-film to form a first irradiated region. A second laser beam is irradiated to the thin-film in such a way as not to overlap with the first irradiated region, thereby forming a second irradiated region and a non-irradiated region. An alignment mark is formed by using an optical constant difference between the second irradiated region and the non-irradiated region. Therefore, an alignment mark can be formed on the semiconductor thin-film in a laser annealing process.

Moreover, since an alignment mark can be formed on the semiconductor thin-film in a laser annealing process, a process of forming an alignment mark prior to the laser annealing process is unnecessary and at the same time, a process of recognizing or reading an alignment mark is unnecessary in the laser annealing process. Therefore, a semiconductor thin-film can be formed at a low cost and high throughput.

Furthermore, because the first irradiated region is formed by irradiating the first laser beam to the thin-film, an annealed semiconductor region or regions can be formed by the first irradiated region. Thus, an annealed semiconductor region or regions is/are obtainable with a good uniformity.

According to a second aspect of the present invention, another method of forming a semiconductor thin-film is provided, which is the same as the method of the first aspect except that a second laser beam is irradiated in such a way as to overlap with a first irradiated region.

The method of the second aspect comprises:

irradiating a first laser beam to a semiconductor thin-film to form a first irradiated region; and irradiating a second laser beam to the thin-film in such a way as to overlap with the first irradiated region, thereby forming a second irradiated region;

wherein the second laser beam is irradiated to the thin-film to be coaxial with the first laser beam;

and wherein an alignment mark is formed by using an optical constant difference between the first irradiated region and the second irradiated region or between the second irradiated region and a remaining non-irradiated region of the thin-film.

With the method according to the second aspect of the present invention, a first laser beam is irradiated to a semiconductor thin-film to form a first irradiated region. A second laser beam is irradiated to the thin-film in such a way as to overlap with the first irradiated region, thereby forming a second irradiated region. An alignment mark is formed by using an optical constant difference between the first irradiated region and the second irradiated region or between the second irradiated region and a remaining non-irradiated region of the thin-film. Therefore, an alignment mark can be formed on the semiconductor thin-film in a laser annealing process.

Moreover, since an alignment mark can be formed on the semiconductor thin-film in a laser annealing process, a process of forming an alignment mark prior to the laser annealing process is unnecessary and at the same time, a process of recognizing or reading an alignment mark is unnecessary in the laser annealing process. Therefore, a semiconductor thin-film can be formed at a low cost and high throughput.

Furthermore, because the first irradiated region is formed by irradiating the first laser beam to the thin-film, an annealed semiconductor region or regions can be formed by the first irradiated region. Thus, an annealed semiconductor region or regions is/are is obtainable with a good uniformity.

The semiconductor thin-film may or may not include a non-irradiated region. When the thin-film includes a non-irradiated region, an alignment mark is formed by using an optical constant difference between the first and second irradiated regions or between the second irradiated region and the non-irradiated region. When the thin-film does not include any non-irradiated region, an alignment mark is formed by using an optical constant difference between the first and second irradiated regions.

According to a third aspect of the present invention, still another method of forming a semiconductor thin-film is provided, which is the same as the method of the second aspect except that a first laser beam is irradiated to a whole semiconductor thin-film to form a first irradiated region, and that an alignment mark is formed by using an optical constant difference between the first and second irradiated regions.

The method of the third aspect comprises:

irradiating a first laser beam to a whole semiconductor thin-film to form a first irradiated region; and irradiating a second laser beam to the thin-film in such a way as to overlap with the first irradiated region, thereby forming a second irradiated region;

wherein the second laser beam is irradiated to the thin-film to be coaxial with the first laser beam;

and wherein an alignment mark is formed by using an optical constant difference between the first irradiated region and the second irradiated region.

With the method according to the third aspect of the present invention, a first laser beam is irradiated to a whole semiconductor thin-film to form a first irradiated region. A second laser beam is irradiated to the thin-film in such a way as to overlap with the first irradiated region, thereby forming a second irradiated region. An alignment mark is formed by using an optical constant difference between the first and second irradiated regions. Therefore, an alignment mark can be formed on the semiconductor thin-film in a laser annealing process.

Moreover, since an alignment mark can be formed on the semiconductor thin-film in a laser annealing process, a process of forming an alignment mark prior to the laser annealing process is unnecessary and at the same time, a process of recognizing or reading an alignment mark is unnecessary in the laser annealing process. Therefore, a semiconductor thin-film can be formed at a low cost and high throughput.

Furthermore, because the first irradiated region is formed by irradiating the first laser beam to the whole thin-film, an annealed semiconductor region or regions can be formed by the first irradiated region. Thus, an annealed semiconductor region or regions is/are obtainable with a good uniformity.

In a preferred embodiment of the methods according to the first, second, and third aspects of the invention, the second laser beam is controlled in such a way that the second irradiated region is solid.

In another preferred embodiment of the methods according to the first, second, and third aspects of the invention, the second laser beam is controlled in such a way that the second irradiated region is hollow due to ablation.

In still another preferred embodiment of the methods according to the first, second, and third aspects of the invention, the first irradiated region serves as at least one annealed semiconductor region, in which active regions of TFTs are formed.

In a further preferred embodiment of the methods according to the first, second, and third aspects of the invention, the semiconductor thin-film is made of a-Si (amorphous silicon).

In a still further preferred embodiment of the methods according to the first, second, and third aspects of the invention, the semiconductor thin-film is made of poly-Si (polysilicon).

In a still more further preferred embodiment of the methods according to the first, second, and third aspects of the invention, an excimer laser is used to generate the first laser beam.

According to a fourth aspect of the present invention, a laser apparatus is provided, which comprises:

a movable stage on which a target is placed;

a first laser beam generator for generating a first laser beam;

the first laser beam being configured by a first optical system to be irradiated to a semiconductor thin-film as the target on the stage;

a second laser beam generator for generating a second laser beam; and the second laser beam being configured by a second optical system to be irradiated to the thin-film in such a way as to be coaxial with the first laser beam.

With the apparatus according to the fourth aspect of the present invention, a first laser beam generator is provided for generating a first laser beam and a second laser beam generator is provided for generating a second laser beam. The first laser beam is configured by a first optical system to be irradiated to a semiconductor thin-film as the target on the stage. The second laser beam is configured by a second optical system to be irradiated to the thin-film in such a way as to be coaxial with the first laser beam.

Therefore, a first irradiated region can be formed in the semiconductor thin-film placed on the movable stage with the first laser beam. A second irradiated region can be formed in the same thin-film with the second laser beam in such a way as to overlap or not to overlap with the first irradiated region. An alignment mark is formed by using an optical constant difference between the second irradiated region and the non-irradiated region, or between the first irradiated region and the second irradiated region, or between the second irradiated region and the non-overlapped region.

Accordingly, even if a video camera for recognizing or reading an alignment mark and a dedicated chamber thereto are not provided on the apparatus and the stage of the apparatus is not configured to enable its fine positional adjustment, an alignment mark can be formed in the semiconductor thin-film as the target in a laser annealing process. Additionally, the laser apparatus can be configured to have a narrow footprint and a high processing capability, fabricated at a low cost, and operated at a high availability factor.

Moreover, since the alignment mark can be formed in the semiconductor thin-film as the target in a laser annealing process, the thin-film can be formed at a low cost and high throughput in such a way that an annealed semiconductor region is obtainable with a good uniformity.

In a preferred embodiment of the apparatus according to the fourth aspect of the invention, the first laser beam generator and the second laser beam generator are different in size from each other.

In another preferred embodiment of the apparatus according to the fourth aspect of the invention, an excimer laser is used as the first laser beam generator.

In still another preferred embodiment of the apparatus according to the fourth aspect of the invention, the second optical system for the second laser beam includes an optical element movable between a first position in an optical path of the first laser beam and a second position outside the same optical path.

Preferably, when the first laser beam is irradiated to the target, the element is in the second position. When the second laser beam is irradiated to the target, the element is in the first position.

BRIEF DESCRIPTION OF THE DRAWINGS

In order that the present invention may be readily carried into effect, it will now be described with reference to the accompanying drawings.

FIG. 2 is a schematic view showing the layout of the optical elements of a laser apparatus according to the first embodiment of the invention, in which the optical beam from the XeCl excimer laser is irradiated to the a-Si film on the stage.

FIGS. 5A to 5C are schematic, partial perspective views showing the process steps of a method of forming a semiconductor thin-film according to a third embodiment of the invention, respectively.

DETAILED DESCRIPTION OF THE PREFERRED EMBODIMENTS

Figure 1A:
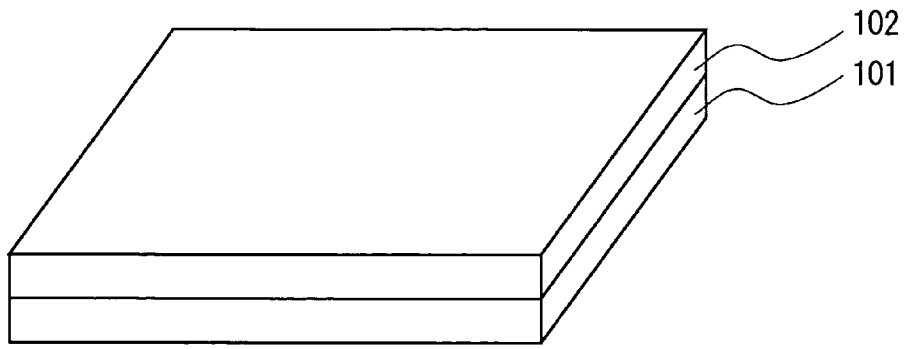
FIGS. 1A to 1C are schematic, partial perspective views showing the process steps of a method of forming a semiconductor thin-film according to a first embodiment of the invention, respectively.

Preferred embodiments of the present invention will be described in detail below while referring to the drawings attached.

First Embodiment

Figure 1B:
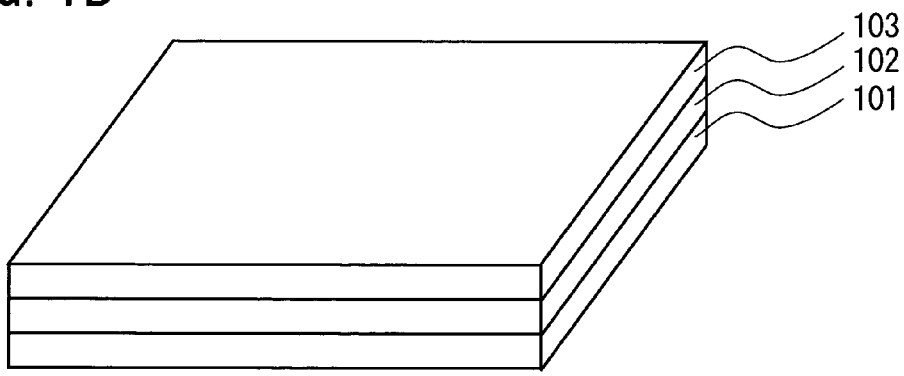
Figure 1C:
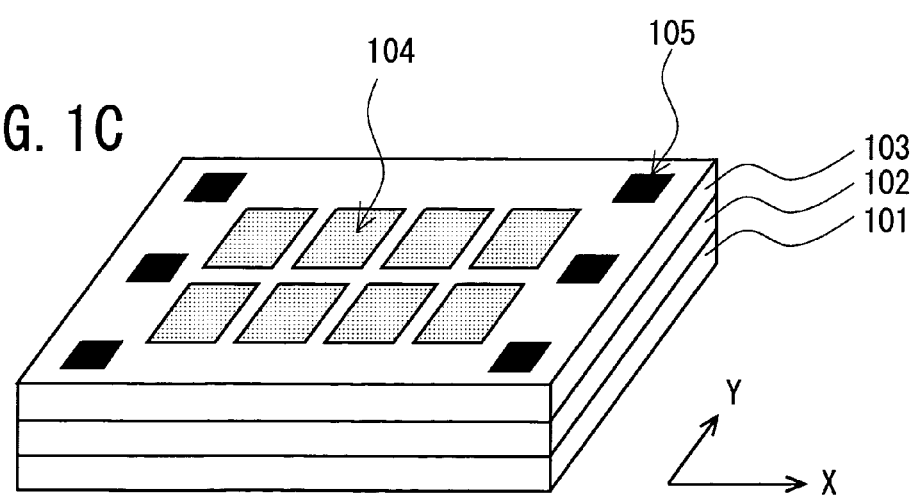

A method of forming a semiconductor thin-film according to a first embodiment of the invention is shown in FIGS. 1A to 1C. In this method, a laser apparatus 200 shown in FIG. 2 is used.

First, as shown in FIG. 1A, a silicon dioxide ($SiO_2$) grounding film 102 is formed on the main surface of a glass plate 101. Thereafter, an a-Si film 103 is formed on the $SiO_2$ film 102. These steps are carried out by a known Plasma-Enhanced Chemical Vapor Deposition (PECVD) method. The $SiO_2$ film 102 has a thickness of 100 nm while the a-Si film 103 has a thickness of 50 nm. The state at this stage is shown in FIG. 1B.

Next, the glass plate 101 on which the films 102 and 103 have been formed is subjected to a dehydrogenation process at 500° C. for 10 minutes. After this dehydrogenation process is completed, the plate 101 with the films 102 and 103 is moved to the inside of the laser apparatus 200. The apparatus 200 has the following structure.

As shown in FIG. 2, the laser apparatus 200 comprises a XeCl excimer pulse laser 211 (pulsed output: 15 J, wavelength: 308 nm) as the first light source, an optical system 212 for leading the optical beam from the laser 211 to a target, a double-frequency neodymium YAG (Nd:YAG) pulse laser 214 (wavelength: 532 nm) as the second light source, an optical system 215 for leading the optical beam from the laser 214 to a target, and a movable stage 216 in a horizontal plane (i.e., the X-Y plane).

The apparatus 200 is configured to operate as a so-called "stepper", in other words, the stage 216 is movable in the step-and-repeat manner in the horizontal plane while the laser beam is selectively irradiated to a desired area of the target (i.e., the glass plate 101 with the films 102 and 103) placed on the stage 216 in each shot. For example, the apparatus 200 can be easily realized by adding the Nd:YAG laser 214 and the optical system 215 to a known stepper structure.

The excimer laser 211 generates an optical beam traveling along the optical path 221. The path 221 is horizontally extended from the laser 211, and is bent downwardly by the mirror 212a of the optical system 212 toward the stage 216. The objective lens 212b of the system 212 is used to focus the beam of the laser 211 toward the target on the stage 216.

The Nd:YAG laser 214 generates an optical beam traveling along the optical path 222. The path 222 is horizontally extended from the laser 214 and is bent upwardly by the mirror 215a of the optical system 215. Thereafter, the path 222 is bent horizontally by the mirror 215b of the optical system 215. Thus, the path 222 is made coaxial with the path 221 in this horizontal part. Then, the path 222 is bent downwardly again by the mirror 212a of the optical system 212 and therefore, the path 222 is coaxial with the path 221 in this vertical part as well. The objective lens 212b of the optical system 212 and the objective lens 215c of the optical system 215 are used to focus the beam of the laser 214 toward the target on the stage 216.

Figure 3:
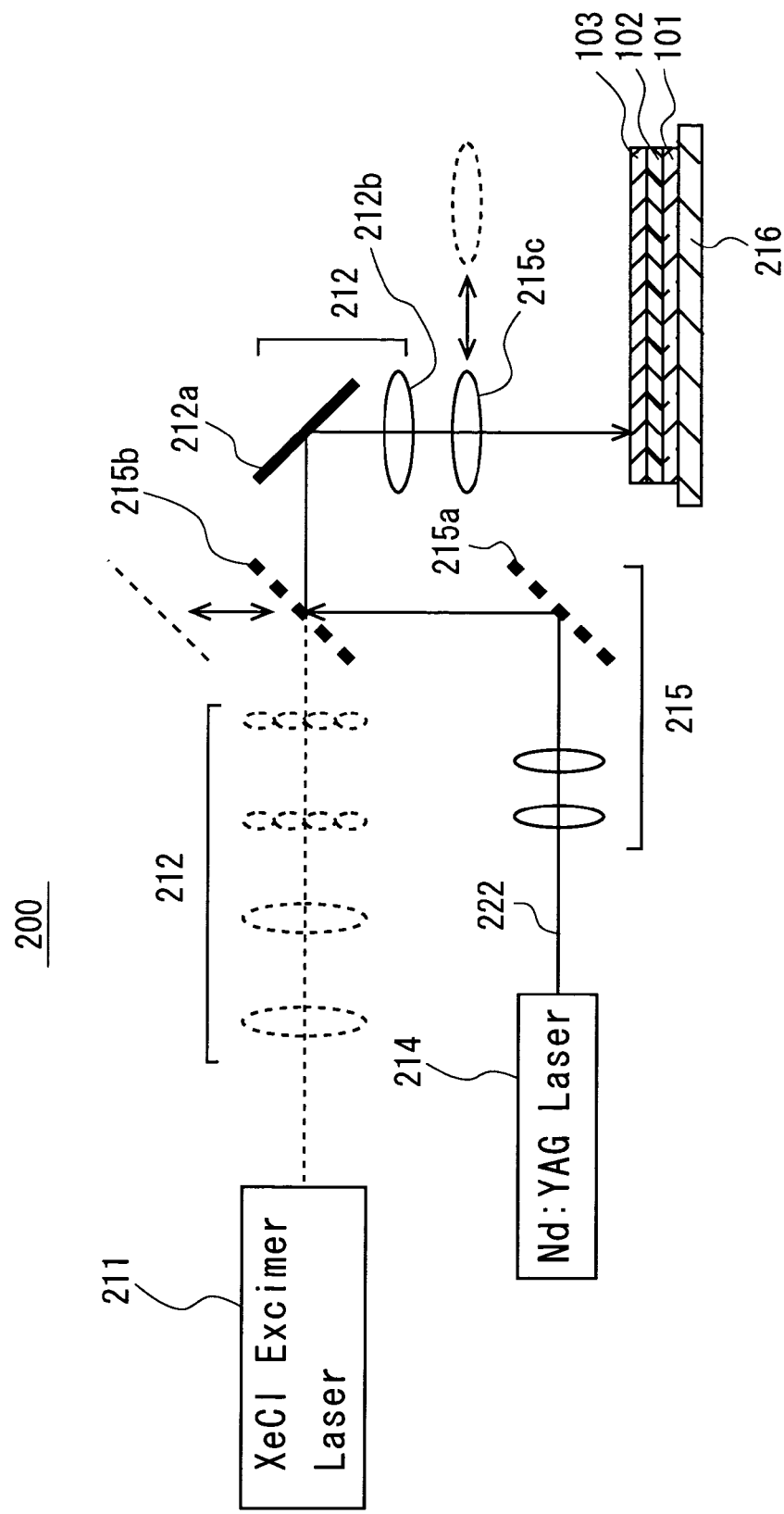
FIG. 3 is a schematic view showing the layout of the optical elements of the laser apparatus according to the first embodiment of the invention, in which the optical beam from the Nd:YAG laser is irradiated to the a-Si film on the stage.

The mirror 215b is movable between the first position on the optical path 221 and the second position outside the path 221. Similarly, the lens 215c is movable between the first position on the optical path 221 and the second position outside the path 221. When the beam from the excimer laser 211 is irradiated to the target on the stage 216, the mirror 215b and the lens 215c are located in their second positions, respectively, as shown in FIG. 2. When the beam from the Nd:YAG laser 214 is irradiated to the target on the stage 216, the mirror 215b and the lens 215c are located in their first positions, respectively, as shown in FIG. 3.

Using the laser apparatus 200 having the above-described structure, poly-Si regions 104 for TFTs and poly-Si regions 105 for alignment marks are formed in the a-Si film 103 on the plate 101 in the following way.

The glass plate 101 on which the $SiO_2$ film 102 and the a-Si 103 are formed, as shown in FIG. 1B, is placed on the stage 216 as the target. On the other hand, the optical beam emitted from the excimer laser 211 is shaped to form a rectangular spot of 41 mm×58 mm on the a-Si film 103 by the optical system 212 and at the same time, the energy density of the said beam is controlled to be 480 mJ/cm² on the film 103. Thereafter, the excimer laser beam thus controlled is selectively irradiated to specific areas of the a-Si film 103 in the form of pulse in the step-and-repeat manner. The irradiation of the said beam is repeated five times (i.e., five shots) in each of the areas. Thus, rectangular irradiated regions 104 are formed in the a-Si film 103, as shown in FIG. 1C. At this time, the regions 104 of the a-Si film 103 are turned to poly-Si regions for forming TFTs. The poly-Si regions 104 are regularly arranged along the X and Y axes.

The rectangular spot size of 41 mm×58 mm of the excimer laser beam is selected to fabricate 2.4 type LCD panels having built-in driver circuits. Therefore, if the glass plate 101 has a size of 550 mm×650 mm, 120 panels of this type are obtainable. This means that the irradiation operation of the excimer laser beam is repeatedly conducted at 120 different points on the same plate 101.

The energy density profile of the excimer laser beam has non-uniform part at its periphery, where the laser energy density is not uniform. The non-uniform part of the profile has a width of approximately 0.3 mm.

The interval between the adjoining LCD panels is set at 1.5 mm. (The interval between the adjoining poly-Si regions 104 is less than 1.5 mm.) This is determined by taking the width of the sealing member of the LCD panel, the cutting margin, and so on into consideration. Since the stage 216 is movable at an accuracy of 0.05 mm or less, the non-uniform part of the excimer laser beam is surely located in the gap between the LCD panels, if the positioning of the said beam with respect to the plate 101 in the step-and-repeat operation is well controlled. The alignment accuracy of an ordinary stepper used for lithography is typically 0.5 µm or less, which is sufficiently high compared with that of the laser apparatus 200.

Subsequently, the optical beam emitted from the double-frequency Nd:YAG pulse laser 214 (wavelength 532 nm) is used to form poly-Si regions 105 for alignment marks in the a-Si film 103. As explained above, the Nd:YAG laser beam is controlled to be coaxial with the excimer laser beam by the optical system 215 before it is irradiated to the target (i.e., the a-Si film 103). The Nd:YAG laser 214 is only used for forming the alignment marks. When the excimer laser 211 is used for forming the poly-Si regions 104 for TFTs, the movable mirror 215b and the lens 215c of the optical system 215 are located outside the optical path 221 of the excimer laser 211, allowing the path 221 to reach the target on the stage 216. On the other hand, when the Nd:YAG laser 214 is used for forming the poly-Si regions 105 for the alignment marks, the movable mirror 215b and the lens 215c of the optical system 215 are located on the optical path 221 of the excimer laser 211, thereby blocking the path 221. Instead, the optical path 222 of the Nd:YAG laser 214 reaches the target on the stage 216 in such a way as to be coaxial with the path 221.

The circular beam diameter of the Nd:YAG laser beam is 100 µm at its output port. The circular spot size of the said laser beam is controlled to be 10 µm on the target. No beam shaping is made to the said beam. The energy density profile of the said laser beam is Gaussian. The energy density of the said beam is controlled to be 150 mJ/cm$^2$. Thereafter, the Nd:YAG laser beam thus controlled is selectively irradiated to specific areas of the a-Si film 103 in the form of pulse in the step-and-repeat manner. The irradiation of the said beam is repeated only once (i.e., single shot) in each of the areas. Thus, dot-shaped irradiated regions 105 are formed in the a-Si film 103, as shown in FIG. 1C. At this time, the regions 105 of the a-Si film 103 are turned to poly-Si regions. The poly-Si regions 105 are regularly arranged along the X and Y axes in such a way as not to overlap with the poly-Si regions 104.

In FIG. 1C, for the sake of simplification, the eight poly-Si regions 104 are arranged in the middle part of the a-Si film 103 and the six poly-Si regions 105 are arranged on the both sides of the middle part. However, actually, the total number of the regions 104 for TFTs is 120, where the regions 104 are arranged in a matrix array. Similarly, the total number of the poly-Si regions 105 is different from the actual total number thereof. Moreover, each region 105 is illustrated in black in FIG. 1C; however, actually, the Nd:YAG laser beam is repeatedly irradiated to the thin-film 103 in such a way as to form a plurality of dots in three rows along the X axis and in three columns along the Y axis in each region 105.

Since the Nd:YAG laser beam is irradiated in such a way as to be coaxial with the excimer laser beam, the position accuracy of each beam is included within the operation or positioning accuracy of the stage 216. If the Nd:YAG laser beam is not irradiated in such a way as to be coaxial with the excimer laser beam, an angular error between these two beams is added to the positioning error of the stage 216 and therefore, the overall or total positioning error is likely to increase.

Instead of the Nd:YAG laser 214 for making alignment marks, any other laser such as argon (Ar) laser and a carbon dioxide ($CO_2$) laser may be used. However, anti-reflection coating for the wavelength of 308 nm is applied to the respective optical elements of the optical system 212. Thus, taking the absorption coefficient of the a-Si film 103 and the utilization efficiency of the apparatus 200 into consideration, it is preferred that the wavelength of the Nd:YAG laser 214 is as close to 308 nm as possible.

Since an excimer laser is expensive, a comparatively inexpensive Nd:YAG laser is used for forming the alignment marks here. Although the Nd:YAG laser 214 is a pulsed laser, it may be a CW (Continuous Wave) laser. Moreover, a quadruple-frequency Nd:YAG pulse laser (wavelength 266 nm) may be used instead of the double-frequency Nd:YAG laser 214. In this case, however, the laser apparatus 200 will have less power and higher cost.

In the optical system 215 for making the alignment marks, the Nd:YAG laser beam may be shaped with a diffuser and then, the marks may be formed with the shaped beam by the known mask image method. In this case, however, there arises a disadvantage that the utilization efficiency of the said laser beam is lowered. Therefore, if the operation accuracy of the stage 216 is sufficiently high, it is preferred that the marks are formed by the spots generated by simply irradiating the unshaped beam to the a-Si film 103.

Through the above-described process steps, the poly-Si regions 104 for TFTs and the poly-Si regions 105 for alignment marks are regularly formed in the a-Si film 103, as shown in FIG. 1C. Subsequently, a resist is coated onto film 103 and then, the plate 101 is transferred into a stepper (not shown) for optical lithography. The plate 101 on which the resist has been coated is placed on the stage (not shown) of the stepper. Thereafter, an exposure beam is repeatedly irradiated to the resist on the plate 101 in the form of shot while moving the stage in a step-and-repeat manner, thereby forming island-shaped patterns in the resist. The island-shaped patterns are used for patterning the respective poly-Si regions 104 to form poly-Si island-shaped active regions of TFTs. In this exposure process, the positioning of the stage is made accurately, because the poly-Si regions 105 serve as the alignment marks for aligning the exposure beam with each of the poly-Si regions 104. Each of the marks or regions 105 is surrounded by the remaining a-Si film 103, where the optical constants of the poly-Si region 105 are quite different from those of the a-Si film 103. Therefore, there is no problem in reading or recognizing the marks 105, in other words, the regions 105 operate as the alignment marks.

Thereafter, the plate 101 on which the patterned resist has been formed is subjected to an ordinary process sequence for fabricating the low-temperature poly-Si TFTs. Specifically, a dry etching process for forming the poly-Si islands is carried out using the patterned resist as a mask, and then, a process for forming the gate dielectric film, a process for forming the gate electrode, a process for doping an impurity into the poly-Si islands, a process for annealing the dopant thus introduced, a process for forming source and drain electrodes, and so on, are carried out successively. In this way, poly-Si TFTs are formed on the glass plate 101.

With the method of forming a semiconductor thin-film according to the first embodiment of the invention, the excimer laser beam is irradiated to the a-Si thin-film 103 to form the irradiated regions 104. The Nd:YAG laser beam is irradiated to the thin-film 103 in such a way as not to overlap with the irradiated regions 104, thereby forming the irradiated regions 105 and the remaining non-irradiated region. An alignment mark is formed by using an optical constant difference between each of the irradiated region 105 and the remaining non-irradiated region (i.e., the a-Si film 103). Therefore, the alignment mark can be formed on the a-Si thin-film 103 in a laser annealing process.

Moreover, since the alignment marks can be formed on the a-Si thin-film 103 in a laser annealing process, a process of forming alignment marks prior to the laser annealing process is unnecessary and at the same time, a process of recognizing or reading alignment marks is unnecessary in the laser annealing process. Therefore, the a-Si thin-film 103 in which the poly-Si regions 104 and 105 are arranged can be formed at a low cost and high throughput.

Furthermore, because the irradiated regions or poly-Si regions 104 are formed by irradiating the excimer laser beam to the thin-film 103, the annealed semiconductor (i.e., poly-Si) regions are formed by the irradiated region 104. Thus, desired annealed semiconductor regions are obtainable with a good uniformity.

According to the inventor's test, the poly-Si alignment marks 105 formed by the method of the first embodiment were able to be distinguished from their a-Si surrounding areas due to their optical constant difference without any problem. Therefore, it was confirmed that the advantages of the invention were obtainable in the first embodiment.

Second Embodiment

Figure 4A:
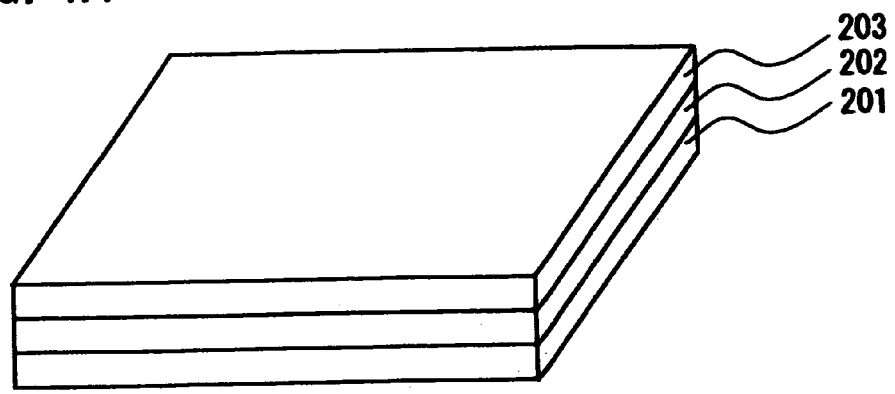
FIGS. 4A to 4C are schematic, partial perspective views showing the process steps of a method of forming a semiconductor thin-film according to a second embodiment of the invention, respectively.
Figure 4B:
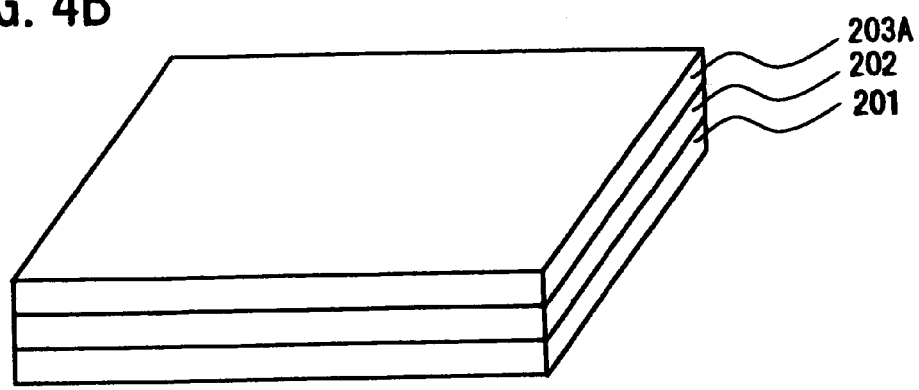
Figure 4C:
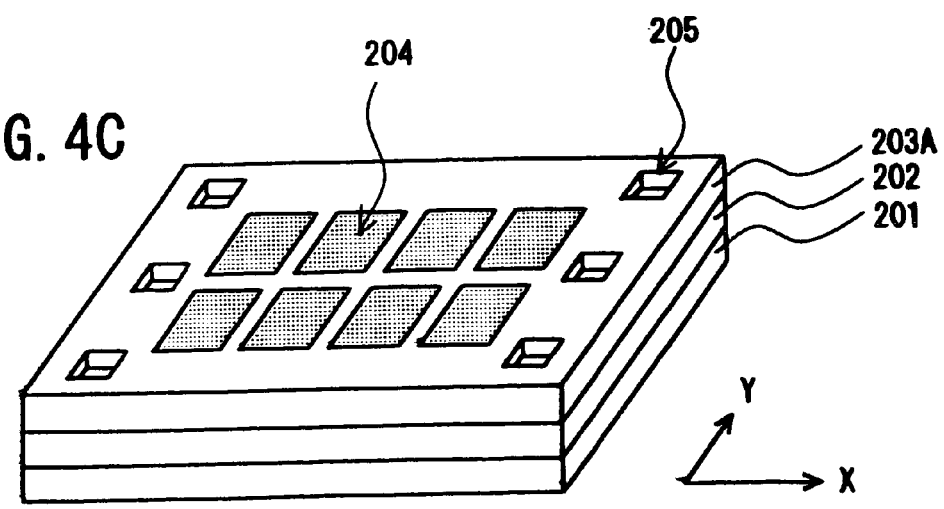

A method of forming a semiconductor thin-film according to a second embodiment of the invention is shown in FIGS. 4A to 4C. In this method, the laser apparatus 200 shown in FIG. 2 is used.

First, as shown in FIG. 4A, a $SiO_2$ grounding film 202 (100 nm in thickness) is formed on the main surface of a glass plate 201. Thereafter, an a-Si film 203 (50 nm in thickness) is formed on the $SiO_2$ film 202. These steps are carried out by the same method as used in the first embodiment. The state at this stage is shown in FIG. 4A.

Next, the glass plate 201 on which the films 202 and 203 have been formed is subjected to an annealing process at 580° C. for 15 hours, thereby converting the whole a-Si film 203 to a solid-phase grown poly-Si film 203A.

Thereafter, the plate 201 with the films 202 and 203A is moved to the inside of the laser apparatus 200 used in the first embodiment. The optical beam emitted from the excimer laser 211 is shaped to form a rectangular spot of 36 mm×51 mm on the poly-Si film 203A by the optical system 212 and at the same time, the energy density of the said beam is controlled to be 550 $mJ/cm^2$. Thereafter, the excimer laser beam thus controlled is selectively irradiated to specific areas of the poly-Si film 203A in the form of pulse in the step-and-repeat manner. The irradiation of the said beam is repeated three times (i.e., three shots) in each of the areas. Thus, rectangular irradiated regions 204 are formed in the poly-Si film 203 due to re-crystallization, as shown in FIG. 4C. The poly-Si regions 204 thus formed are regularly arranged along the X and Y axes.

The rectangular spot size of 36 mm×51 mm of the excimer laser beam is selected to fabricate 2.1 type LCD panels having built-in driver circuits.

Subsequently, the optical beam emitted from the double-frequency Nd:YAG pulse laser 214 is used to form poly-Si regions 205 for alignment marks in the poly-Si film 203A.

As explained above, the Nd:YAG laser beam is controlled to be coaxial with the excimer laser beam by the optical system 215 before it is irradiated to the target (i.e., the poly-Si film 203A). The energy density of the said beam is controlled to be 400 $mJ/cm^2$. The Nd:YAG laser beam thus controlled is selectively irradiated to specific areas of the poly-Si film 203A in the form of pulse in the step-and-repeat manner. The irradiation of the said beam is repeated 30 times (i.e., 30 shots) in each of the areas. Thus, dot-shaped irradiated regions 205 are formed in the poly-Si film 203A, as shown in FIG. 4C. The poly-Si regions 205 are regularly arranged along the X and Y axes in such a way as not to overlap with the poly-Si regions 204.

Because of the repeated irradiation of the Nd:YAG laser beam to the poly-Si film 203A, the irradiated parts of the film 203A are selectively removed due to "ablation". Thus, unlike the first embodiment, the alignment marks are generated by the hollow regions 205 of the film 203A. In the first embodiment, the irradiated regions 105 are solid because they are not removed due to ablation. Similar to the first embodiment, the alignment marks may be generated by the hollow irradiated regions 205 of the film 203A.

With the method of forming a semiconductor thin-film according to the second embodiment of the invention, the alignment marks are realized by the optical constant difference between the hollow regions 205 and the remaining poly-Si film 203A. Therefore, the same advantages as those in the first embodiment are obtainable.

According to the inventor's test, the hollow alignment marks 205 formed by the method of the second embodiment were able to be distinguished from their surrounding areas made of poly-Si due to their optical constant difference without any problem. Therefore, it was confirmed that the advantages of the invention were obtainable in the second embodiment as well.

Third Embodiment

A method of forming a semiconductor thin-film according to a third embodiment of the invention is shown in FIGS. 5A to 5C. In this method, the laser apparatus 200 shown in FIG. 2 is used. The method of the third embodiment is the same as the second embodiment except that the poly-Si regions for alignment marks are located in the corresponding poly-Si regions for TFTs.

Specifically, first, as shown in FIG. 5A, a $SiO_2$ grounding film 302 (100 nm in thickness) is formed on the main surface of a glass plate 301 and thereafter, an a-Si film 303 (50 nm in thickness) is formed on the $SiO_2$ film 202. Next, the glass plate 301 on which the films 302 and 303 have been formed is subjected to an annealing process at 580° C. for 15 hours, thereby converting the a-Si film 303 to a solid-phase grown poly-Si film 303A. Thereafter, the plate 301 with the films 302 and 303A is moved to the inside of the laser apparatus 200 used in the first embodiment.

The optical beam emitted from the excimer laser 211 is selectively irradiated to specific areas of the poly-Si film 303A in the form of pulse in the step-and-repeat manner. The irradiation of the said beam is repeated three times (i.e., three shots) in each of the areas. Thus, rectangular irradiated regions 304 are formed in the poly-Si film 303A, as shown in FIG. 5C. The poly-Si regions 304 are regularly arranged along the X and Y axes.

Subsequently, the optical beam emitted from the double-frequency Nd:YAG pulse laser 214 is selectively irradiated to the poly-Si film 303A in the form of pulse in the step-and-repeat manner. The irradiation of the said beam is repeated 30 times (i.e., 30 shots) in each of the areas. Thus, dot-shaped irradiated regions 305 are formed in the corresponding poly-Si regions 304A, as shown in FIG. 5C. Each of the poly-Si regions 305 is located in (i.e., overlapped with) a corresponding one of the poly-Si regions 304, where the edges of the region 305 are aligned with the corresponding edges of the region 304.

Because of the repeated irradiation of the Nd:YAG laser beam to the poly-Si film 303A, the irradiated parts of the film 303A in the poly-Si regions 304 are selectively removed due to "ablation". Thus, similar to second embodiment, the alignment marks are generated by the hollow regions 305 of the film 303A.

With the method of forming a semiconductor thin-film according to the third embodiment of the invention, each of the hollow regions 305 is located in (i.e., overlapped with) a corresponding one of the poly-Si regions 304, where the edges of the region 305 are aligned with the corresponding edges of the region 304. The alignment marks are realized by the optical constant difference between the hollow regions 305 and the corresponding poly-Si regions 304, and/or between the hollow regions 305 and the remaining non-irradiated region of the poly-Si film 303A. Therefore, the same advantages as those in the first embodiment are obtainable.

Similar to the first embodiment, the alignment marks may be generated by using the solid irradiated regions 305 of the film 303A. Each region 305 may be partially overlapped with the corresponding region 304, in which the region 305 is overlapped with the non-irradiated region of the film 303A.

According to the inventor's test, the alignment marks formed by the method of the third embodiment were able to be distinguished from their surrounding areas due to their optical constant difference without any problem. Therefore, it was confirmed that the advantages of the invention were obtainable in the third embodiment as well.

Fourth Embodiment

Figure 6A:
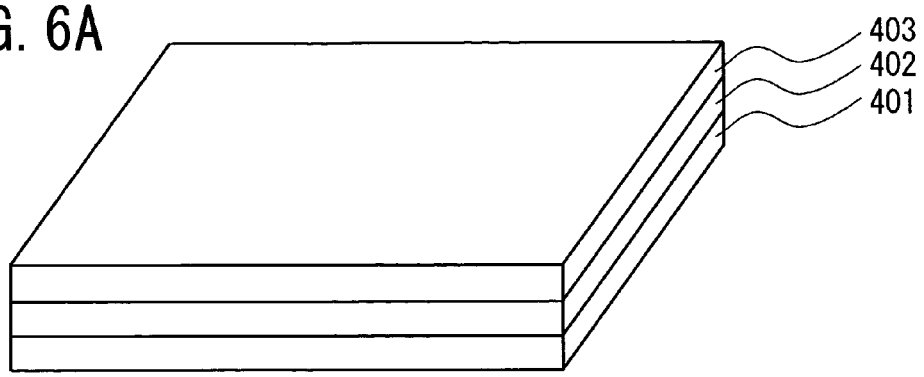
FIGS. 6A to 6C are schematic, partial perspective views showing the process steps of a method of forming a semiconductor thin-film according to a fourth embodiment of the invention, respectively.
Figure 6B:
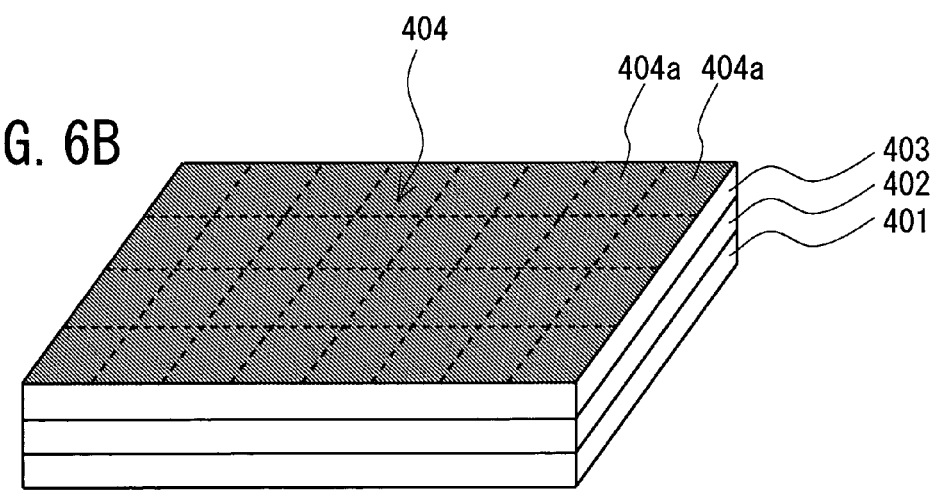
Figure 6C:
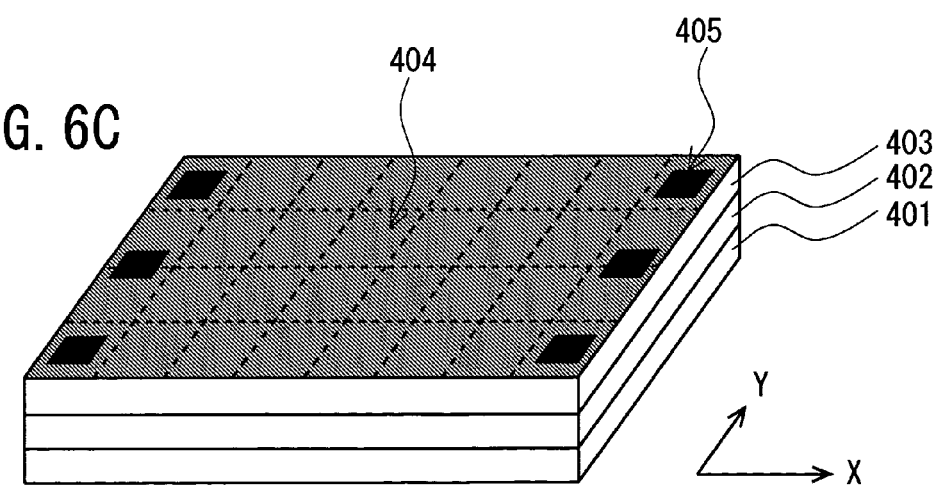

A method of forming a semiconductor thin-film according to a fourth embodiment of the invention is shown in FIGS. 6A to 6C. In this method, the laser apparatus 200 shown in FIG. 2 is used.

First, as shown in FIG. 6A, a $SiO_2$ grounding film 402 (100 nm in thickness) is formed on the main surface of a glass plate 401. Thereafter, an a-Si film 403 (50 nm in thickness) is formed on the $SiO_2$ film 402. These steps are carried out by the same method as used in the first embodiment. The state at this stage is shown in FIG. 6A.

Next, the plate 401 with the films 402 and 403 is moved to the inside of the laser apparatus 200 used in the first embodiment. The optical beam emitted from the excimer laser 211 is shaped to form the same rectangular spot as used in the first embodiment on the a-Si film 403 and at the same time, the energy density of the said beam is controlled to be the same value as used in the first embodiment. Thereafter, the excimer laser beam is selectively irradiated to specific areas of the a-Si film 403 in the form of pulse in the step-and-repeat manner. The irradiation of the said beam is repeated three times (i.e., three shots) in each of the areas. Thus, rectangular irradiated regions 404a are formed in the a-Si film 403 due to crystallization, as shown in FIG. 6B. The poly-Si regions 404a thus formed are regularly arranged along the X and Y axes.

Unlike the first embodiment, the rectangular irradiated regions 404a are closely arranged over the whole film 403.

Thus, these poly-Si regions 404a constitute a single poly-Si region or layer 404 covering the entire surface of the plate 401.

Subsequently, the optical beam emitted from the double-frequency Nd:YAG pulse laser 214 is used to form poly-Si regions 405 for alignment marks in the poly-Si layer 404. Thus, the regions 405 are formed in such a way as to overlap with the poly-Si layer 404 (i.e., the poly-Si regions 404a). As explained above, the Nd:YAG laser beam is controlled to be coaxial with the excimer laser beam by the optical system 215 before it is irradiated to the target (i.e., the poly-Si layer 404). The energy density of the said beam is controlled to be the same value as the first embodiment. The Nd:YAG laser beam is selectively irradiated to specific areas of the poly-Si layer 404 in the form of pulse in the step-and-repeat manner. The irradiation of the said beam is repeated 30 times (i.e., 30 shots) in each of the areas. Thus, dot-shaped irradiated regions 405 are formed in the poly-Si layer 404, as shown in FIG. 6C. The poly-Si regions 405 are regularly arranged along the X and Y axes.

With the method of forming a semiconductor thin-film according to the fourth embodiment of the invention, the alignment marks are realized by the optical constant difference between the solid poly-Si regions 405 and the remaining poly-Si layer 404 (i.e., the poly-Si regions 404a). Therefore, the same advantages as those in the first embodiment are obtainable.

Similar to the second embodiment, the alignment marks may be generated by the solid irradiated regions 405 in the said fourth embodiment as well.

According to the inventor's test, the solid alignment marks 405 formed by the method of the fourth embodiment were able to be distinguished from their surrounding areas made of poly-Si due to their optical constant difference without any problem. Therefore, it was confirmed that the advantages of the invention were obtainable in the fourth embodiment as well.

Other Embodiments

It is needless to say that the invention is not limited to the above-described embodiment. Any modification is applicable to the embodiment. For example, although a-Si film is used in the above-described first to fourth embodiments as the target film, any other semiconductor material may be used for this purpose. Needless to say, the plan shape of the irradiated regions for the alignment marks may be optionally changeable as necessary.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of forming a semiconductor thin-film, comprising:
   irradiating a first laser beam to a semiconductor thin-film to form a first irradiated region; and
   irradiating a second laser beam to the thin-film in such a way as not to overlap with the first irradiated region, thereby forming a second irradiated region and a non-irradiated region;
   wherein the second laser beam is irradiated to the thin-film to be coaxial with the first laser beam;

and wherein an alignment mark is formed by using an optical constant difference between the second irradiated region and the non-irradiated region.

2. The method according to claim 1, wherein the second laser beam is controlled in such a way that the second irradiated region is solid.

3. The method according to claim 1, wherein the second laser beam is controlled in such a way that the second irradiated region is hollow due to ablation.

4. The method according to claim 1, wherein the first irradiated region serves as an annealed semiconductor region, in which an active region of a TFT is formed.

5. The method according to claim 1, wherein the semiconductor thin-film is made of a-Si (amorphous silicon).

6. The method according to claim 1, wherein the semiconductor thin-film is made of poly-Si (polysilicon).

7. The method according to claim 1, wherein an excimer laser is used to generate the first laser beam.

8. A method of forming a semiconductor thin-film, comprising:
  irradiating a first laser beam to a semiconductor thin-film to form a first irradiated region; and
  irradiating a second laser beam to the thin-film in such a way as to overlap with the first irradiated region, thereby forming a second irradiated region;
  wherein the second laser beam is irradiated to the thin-film to be coaxial with the first laser beam;
  and wherein an alignment mark is formed by using an optical constant difference between the first irradiated region and the second irradiated region or between the second irradiated region and a remaining non-irradiated region of the thin-film.

9. The method according to claim 8, wherein the second laser beam is controlled in such a way that the second irradiated region is solid.

10. The method according to claim 8, wherein the second laser beam is controlled in such a way that the second irradiated region is hollow due to ablation.

11. The method according to claim 8, wherein the first irradiated region serves as a annealed semiconductor region, in which an active region of a TFT is formed.

12. The method according to claim 8, wherein the semiconductor thin-film is made of a-Si (amorphous silicon).

13. The method according to claim 8, wherein the semiconductor tin-film is made of poly-Si film (polysilicon).

14. The method according to claim 8, wherein an excimer laser is used to generate the first laser beam.

15. A method of forming a semiconductor thin-film, comprising:
  irradiating a first laser beam to a whole semiconductor tin-film to form a first irradiated region; and
  irradiating a second laser beam to the thin-film in such a way as to overlap wit the first irradiated region, thereby forming a second irradiated region;
  wherein the second laser beam is irradiated to the thin-film to be coaxial with the first lager beam;
  and wherein an alignment mark is formed by using an optical constant difference between the first irradiated region and the second irradiated region.

16. The method according to claim 15, wherein the second laser beam is controlled in such a way that the second irradiated region is solid.

17. The method according to claim 15, wherein the second laser beam is controlled in such a way that the second irradiated region is hollow due to ablation.

18. The method according to claim 15, wherein the first irradiated region serves as an annealed semiconductor region, in which an active region of a TFT is formed.

19. The method according to claim 15, wherein the semiconductor thin-film is made of a-Si (amorphous silicon).

20. The method according to claim 15, wherein the semiconductor thin-film is made of poly-Si (polysilicon).

21. The method according to claim 15, wherein an excimer laser is used to generate the first laser beam.

* * * * *